United States Patent
Franke et al.

(10) Patent No.: US 10,854,540 B2
(45) Date of Patent: Dec. 1, 2020

(54) PACKAGED IC COMPONENT

(71) Applicant: TDK-Micronas GmbH, Freiburg (DE)

(72) Inventors: Joerg Franke, Freiburg (DE); Thomas Leneke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 17 days.

(21) Appl. No.: 16/030,507

(22) Filed: Jul. 9, 2018

(65) Prior Publication Data
US 2019/0013267 A1   Jan. 10, 2019

(30) Foreign Application Priority Data

Jul. 7, 2017  (DE) .................. 10 2017 006 406

(51) Int. Cl.
| | |
|---|---|
| *H01L 23/498* | (2006.01) |
| *H01R 12/71* | (2011.01) |
| *H01R 12/70* | (2011.01) |
| *H01L 23/31* | (2006.01) |
| *H01R 12/58* | (2011.01) |

(52) U.S. Cl.
CPC .... *H01L 23/49861* (2013.01); *H01L 23/3121* (2013.01); *H01L 23/49811* (2013.01); *H01R 12/7064* (2013.01); *H01R 12/71* (2013.01); *H01R 12/585* (2013.01)

(58) Field of Classification Search
CPC .............. H01L 23/49861; H01L 23/3121
See application file for complete search history.

(56) References Cited

U.S. PATENT DOCUMENTS

| | | | |
|---|---|---|---|
| 9,455,502 B2 | 9/2016 | Guenter et al. | |
| 9,769,945 B2 | 9/2017 | Loibl et al. | |
| 9,893,005 B2 | 2/2018 | Heberle et al. | |
| 2010/0170706 A1 | 7/2010 | Kimmich et al. | |
| 2012/0257099 A1* | 10/2012 | Tsai ................. | G02B 7/08 348/349 |

(Continued)

FOREIGN PATENT DOCUMENTS

| | | |
|---|---|---|
| DE | 102007032142 A1 | 1/2009 |
| DE | 102012204004 A1 | 9/2013 |

(Continued)

*Primary Examiner* — Didarul A Mazumder
*Assistant Examiner* — Wasiul Haider
(74) *Attorney, Agent, or Firm* — Muncy, Geissler, Olds & Lowe, P.C.

(57) ABSTRACT

A packaged IC component having a semiconductor body and a printed circuit board. The semiconductor body includes a monolithically integrated circuit and at least two metal contact areas. The printed circuit board has a first and second region and a top and a bottom. At least two formed terminal contacts and two conductive traces are connected to the terminal contacts, and the terminal contacts are designed as contact holes passing through the printed circuit board, and are arranged in the first region of the printed circuit board. The two metal contact areas are connected to the conductive traces by bond wires, and the semiconductor body is implemented as a die. The die is arranged in the second region on the top of the printed circuit board, and the semiconductor body and the bond wires are completely covered with a potting compound on the top of the printed circuit board.

14 Claims, 3 Drawing Sheets

(56) References Cited

U.S. PATENT DOCUMENTS

| | | | |
|---|---|---|---|
| 2015/0102478 A1* | 4/2015 | Suthiwongsunthorn | ..................... H01L 24/45 257/680 |
| 2016/0204055 A1* | 7/2016 | Heberle | ............ H01L 23/49827 257/774 |
| 2018/0123300 A1 | 5/2018 | Hansen et al. | |
| 2018/0192507 A1* | 7/2018 | Schowel | .............. H05K 1/0203 |
| 2019/0029133 A1* | 1/2019 | Schramme | ............ H01M 10/48 |
| 2019/0253810 A1* | 8/2019 | Pawlowski | ............. G06F 13/42 |

FOREIGN PATENT DOCUMENTS

| | | |
|---|---|---|
| DE | 102012213812 A1 | 2/2014 |
| DE | 102014202158 A1 | 8/2015 |
| DE | 102015000063 A1 | 7/2016 |
| DE | 102015206481 A1 | 10/2016 |
| JP | H 11-224913 A | 8/1999 |
| JP | 2016-201436 A | 12/2016 |

* cited by examiner

PACKAGED IC COMPONENT

This nonprovisional application claims priority under 35 U.S.C. § 119(a) to German Patent Application No. 10 2017 006 406.7, which was filed in Germany on Jul. 7, 2017, and which is herein incorporated by reference.

BACKGROUND OF THE INVENTION

Field of the Invention

The invention relates to a packaged IC component.

Description of the Background Art

Packaged IC components are known from DE 10 2007 032 142 A1 (which corresponds to US 2010/0170706) and DE 10 2015 000 063 A, which corresponds to U.S. Pat. No. 9,893,005, which is incorporated herein by reference. Press-in contacts are known from DE 10 2012 213 812 A1 (which corresponds to U.S. Pat. No. 9,455,502), DE 10 2014 202 158 A1, DE 10 2012 204 004 A1 (which corresponds to U.S. Pat. No. 9,769,945), and DE 10 2015 206 481 A1 (which corresponds to US 2018/0123300).

SUMMARY OF THE INVENTION

It is an object of the invention to specify a device that advances the conventional art.

According to an exemplary embodiment of the invention, a packaged IC component, having a semiconductor body and printed circuit board, is provided.

The semiconductor body includes a monolithically integrated circuit and at least two metal contact areas.

The printed circuit board has a first region and a second region and a top and a bottom.

Furthermore, the printed circuit board has at least two formed terminal contacts, and two conductive traces connected to the terminal contacts.

The terminal contacts can be designed as, for example, contact holes passing through the printed circuit board, and can be arranged in the first region of the printed circuit board.

The two metal contact areas can be connected to the conductive traces by means of bond wires, and the semiconductor body can be implemented as a die.

The die can be arranged in the second region on the top of the printed circuit board.

The semiconductor body and the bond wires may be completely covered with a potting compound on the top of the printed circuit board.

The top of the printed circuit board can also be covered with the potting compound in the second region, wherein the bottom of the printed circuit board forms a part of the IC package.

The contact holes can have a uniform inside diameter with metal inside walls, and are formed to accommodate electrically conductive press-fit pins in order to create a press-fit connection, and thus an electrically conductive connection, to at least one additional electrical component.

The printed circuit board has no potting compound in the first region.

The press-fit pins are implemented as part of a stamped lead frame, and are joined to the stamped lead frame as a single piece.

The printed circuit board forms a non-positive, i.e. frictional, and at least partially integral connection via the press-fit pins, and forms an electrically conductive connection to the stamped lead frame via the press-fit pins.

It is a matter of course that the printed circuit board has no additional retaining elements aside from the press-fit pins, which is to say it has no other frictional connection. The stamped lead frame can include or consists of multiple metal, conductive strips, and can be at least partially molded-in with a plastic. In other words, the stamped lead frame is embedded in a package, and is designed as part of the package, and is frictionally connected to the package. In other words, the printed circuit board forms a frictional connection to the package solely by means of the press-fit pins.

It should be noted that cold welding takes place when the press-fit pins are pressed in, which is to say the press-fit pins have, at least in part, positive engagement with the inside surface of the contact holes. The printed circuit board essentially can have a rectangular shape. The contact holes can be arranged on one of the four outer sides of the printed circuit board. Also, precisely three contact holes can be arranged in a row along one of the outer sides of the printed circuit board.

It should be noted that the printed circuit board with the potting compound can also be referred to as a packaged component or as a packaged IC, wherein the first region and the second region are designed to be contiguous in each case.

The plastic-encased strips of the stamped lead frame form an additional package, wherein the package of the packaged component has a smaller lateral extent than the size of the package of the additional package. The packaged component can be implemented on the top of the additional package.

The stamped lead frame can have a number of metal strips that is exactly the same as the number of contact holes present in the printed circuit board.

An advantage is that the printed circuit board with the die can be connected directly to a plug or to a socket in a simple and economical manner without the need for soldering or adhesive bonding or similar steps. Another advantage is that a very reliable connection can be produced by means of the press-fit connection.

The die can be adhesive bonded directly to the top of the printed circuit board. In other words, the die can be applied to the printed circuit board without a lead frame. An economical structure can be achieved in this way. It is a matter of course that the metal contact areas of the semiconductor body are connected directly to the conductive traces on the top of the printed circuit board with the bond wires.

The semiconductor body can include at least one sensor, wherein the sensor is in operative electrical connection with the integrated circuit. The sensor can be implemented as a magnetic field sensor or as a pressure sensor.

The semiconductor body or the integrated circuit can include at least one bus interface circuit, e.g., for a LIN bus and/or a drive circuit for an actuator, e.g., for a motor.

The contact holes on the top of the printed circuit board can be at least 1.5 mm distant from the IC package. At least two, and a maximum of twenty, contact holes may be provided.

One or more passive components, for example, a capacitor and/or a coil and/or a magnet, can be provided in the second region. The passive components in this case are not monolithically integrated on the semiconductor body. The passive components can be completely covered with the potting compound.

The IC package can terminate flush with the edge of the printed circuit board on three sides.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a view of an embodiment according to the invention of a packaged IC component connected to a stamped lead frame, wherein the stamped lead frame is not molded in;

DETAILED DESCRIPTION

Figure 1:
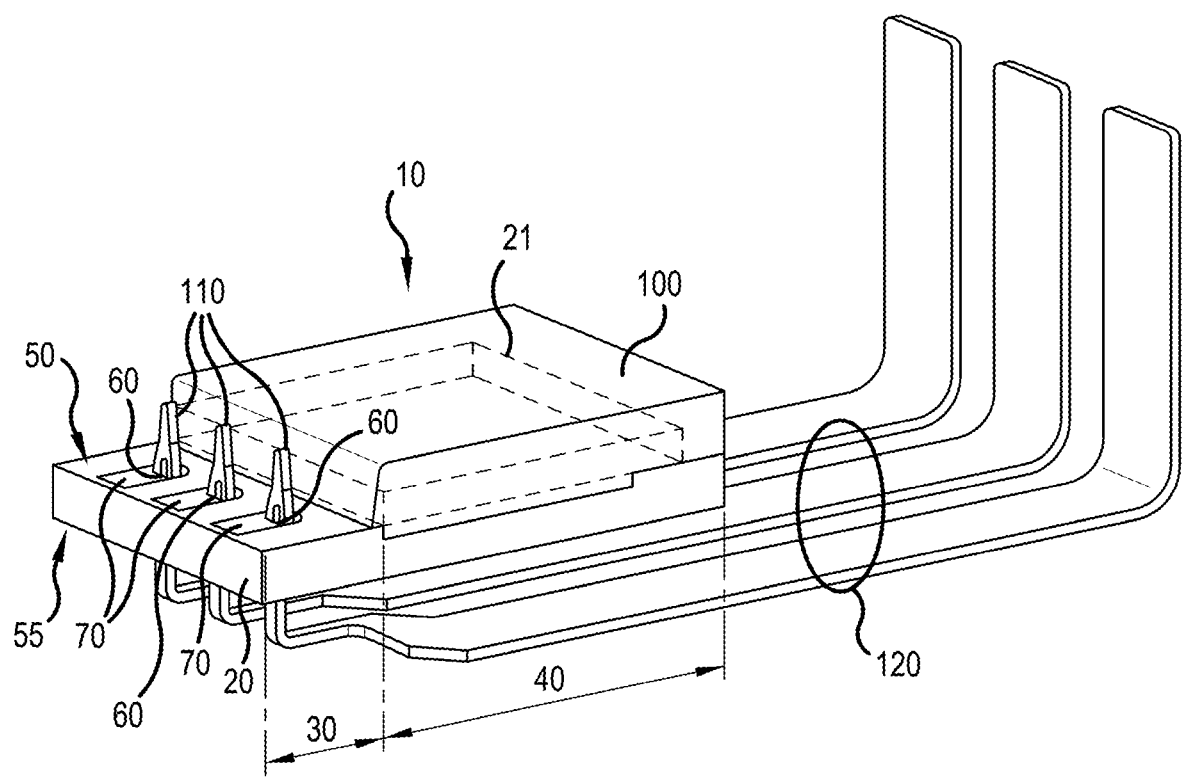

The illustration in FIG. 1 shows a perspective view of an embodiment according to the invention of a packaged IC component 10. The packaged IC component includes a semiconductor body 21 and a printed circuit board 20. The semiconductor body includes a monolithically integrated circuit with at least two metal contact areas.

The printed circuit board 20 has a first region 30 and a second region 40. In addition, the printed circuit board 20 has a top 50 and a bottom 55 and three terminal contacts 60. Each of the terminal contacts 60 is connected to conductive traces 70.

The terminal contacts 60 are designed as contact holes passing through the printed circuit board 20, and are arranged in the first region 30 of the printed circuit board 20.

The metal contact areas are connected to the conductive traces 70 by bond wires.

The semiconductor body can be implemented as a die, and is arranged in the second region 40 on the top 50 of the printed circuit board 20.

The semiconductor body and the bond wires are completely covered with a potting compound 100. The printed circuit board 20, as well, is covered with the potting compound 100 in the second region 40. In this design, the bottom of the printed circuit board 20 forms a part of the IC package.

In the first region, the printed circuit board 20 has no potting compound.

The contact holes have a uniform inside diameter with metal inside walls, and are formed to accommodate electrically conductive press-fit pins 110 in order to create a press-fit connection. The press-fit pins 110 are joined to the stamped lead frame 120 as a single piece, which is to say that the press-fit pins are part of the stamped lead frame 120. In the present case, the stamped lead frame 120 has three metal, conductive strips.

It is a matter of course, however, that the stamped lead frame 120 has a minimum of two strips and a maximum of 20 strips.

The printed circuit board 20 forms a frictional connection solely by means of the press-fit pins 110, and in this way forms an electrically conductive connection to the stamped lead frame 120. It is a matter of course that the press-fit pins 110 also at least partially form an integral connection with the contact holes in that a cold welding takes place during the joining.

Figure 2:
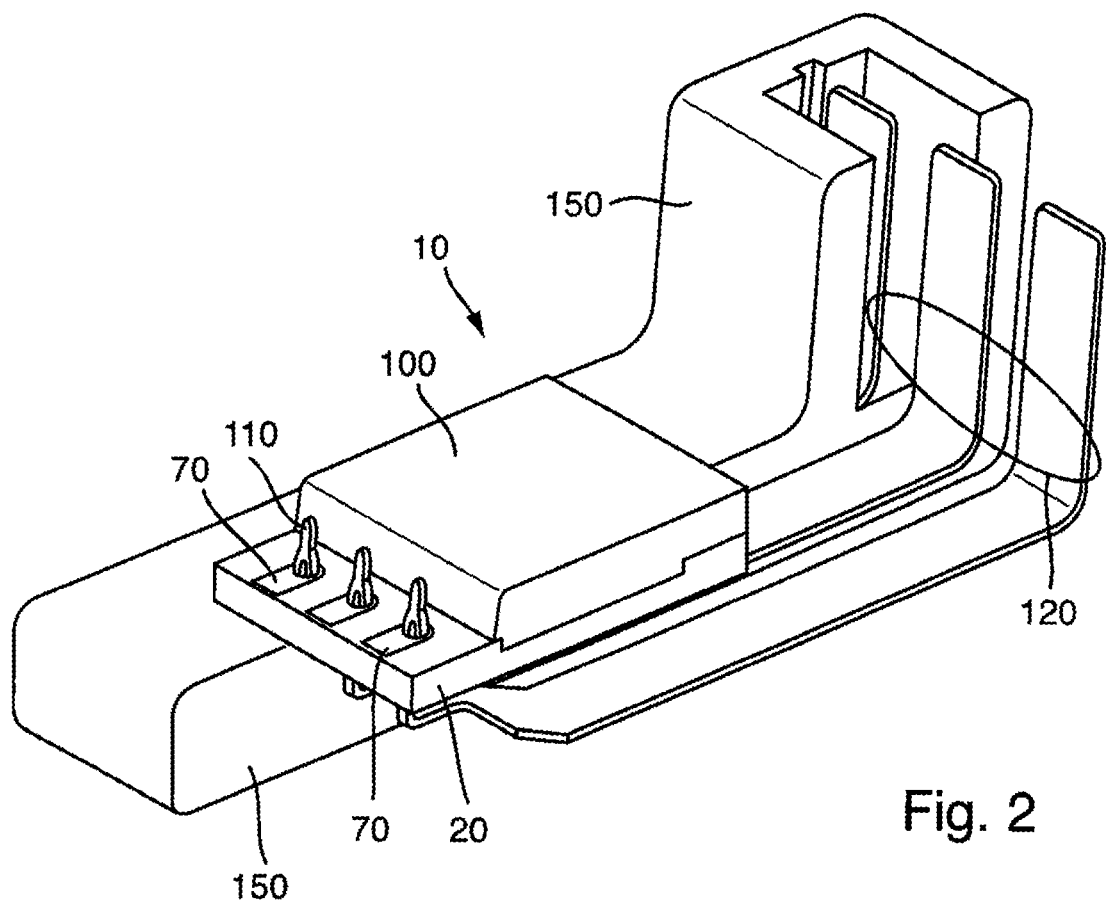
FIG. 2 is a view of the embodiment shown in FIG. 1, with a stamped lead frame that is only partially embedded in a package.
Figure 3:
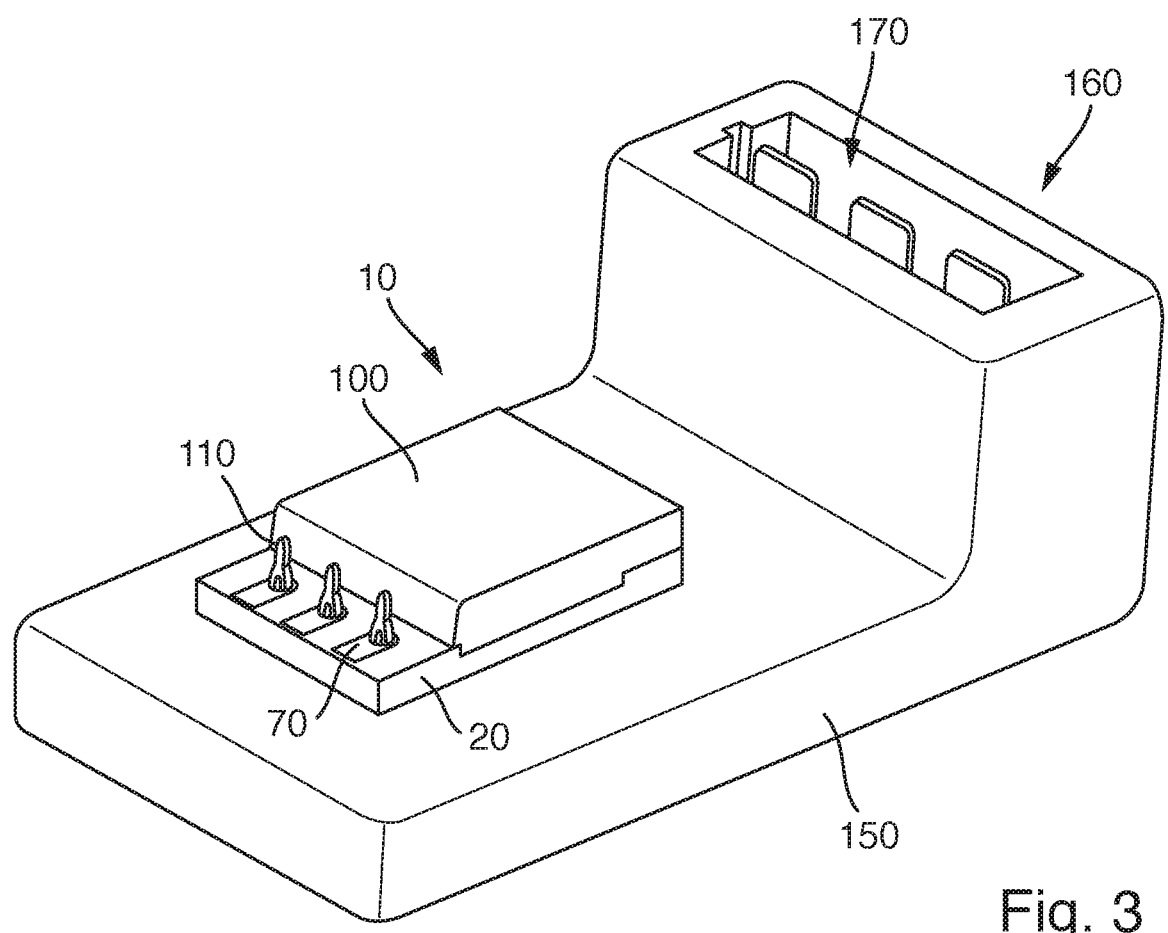
FIG. 3 is a view of the embodiment shown in FIG. 1, wherein all three parts of the stamped lead frame are embedded in the package.

A perspective view of the embodiment shown in FIG. 1 is illustrated in each case in FIG. 2 and FIG. 3. Only the differences from the embodiment in connection with FIG. 1 are explained below. It is a matter of course that FIG. 2 is only added for reasons of illustrating the internal structure of FIG. 3.

Whereas only parts of the stamped lead frame 120 are embedded in a package 150 in FIG. 2, FIG. 3 shows an embedding of all three parts of the stamped lead frame in the package 150.

It is evident that the stamped lead frame 120 is enclosed by the plastic of the package 150, and is now a part of the package 150. At the face 160 of the package 150, the ends of the stamped lead frame 120 form a receptacle 170 for electrically connecting an additional component.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A packaged IC component comprising:
    a semiconductor body that includes a monolithically integrated circuit; and
    a printed circuit board having a first region and a second region and a top and a bottom;
    at least two terminal contacts arranged on the printed circuit board;
    two conductive traces that are connected to the at least two terminal contacts, and
    wherein the two terminal contacts are configured as contact holes passing through the printed circuit board and are arranged in the first region of the printed circuit board,
    wherein the semiconductor body is a die that is arranged in the second region on the top of the printed circuit board,
    wherein the semiconductor body is completely covered with a potting compound on the top of the printed circuit board,
    wherein the printed circuit board is covered with the potting compound in the second region,
    wherein the bottom of the printed circuit board forms a part of the IC package,
    wherein the contact holes have a uniform inside diameter with metal inside walls, and are formed to accommodate electrically conductive press-fit pins to create a press-fit connection and thus an electrical connection to at least one additional electrical component,
    wherein the first region and the second region are designed to be contiguous in each case,
    wherein the press-fit pins are a part of a stamped lead frame and are joined to the stamped lead frame as a single piece,
    wherein the printed circuit board forms a frictional connection solely via the press-fit pins and forms an electrically conductive connection to the stamped lead frame solely by the press-fit pins, wherein an entirety of the first region is devoid of the potting compound, and wherein the first region is aligned with a side of the semiconductor body and extends from the side of the semiconductor body.

2. The packaged IC component according to claim 1, wherein the die is adhesive bonded directly to the top of the printed circuit board.

3. The packaged IC component according to claim 1, wherein the semiconductor body includes at least one sensor, and wherein the sensor is in operative electrical connection with the integrated circuit.

4. The packaged IC component according to claim 3, wherein the sensor is a magnetic field sensor or a pressure sensor.

5. The packaged IC component according to claim 1, wherein the contact holes on the top of the printed circuit board are at least 1.5 mm distant from the IC package.

6. The packaged IC component according to claim 1, wherein at least two contact holes, and a maximum of twenty contact holes, are provided.

7. The packaged IC component according to claim 1, wherein the stamped lead frame is part of a package, wherein parts of the stamped lead frame are molded-in with plastic, and wherein the printed circuit board forms a frictional connection to the package solely by the press-fit pins.

8. The packaged IC component according to claim 7 wherein the parts molded-in with plastic form an additional package, and wherein the package of the packaged component has a smaller lateral extent than the size of the package of the additional package.

9. The packaged IC component according to claim 8, wherein the packaged component is arranged on the top of the additional package.

10. The packaged IC component according to claim 1, wherein the integrated circuit includes a drive circuit for an actuator.

11. The packaged IC component according to claim 1, wherein one or more passive components are arranged in the second region.

12. The packaged IC component according to claim 1, wherein the stamped lead frame includes multiple metal, conductive strips.

13. The packaged IC component according to claim 1, wherein the first region is a portion of the printed circuit on which the semiconductor body is not formed.

14. A packaged IC component comprising:
a semiconductor body that includes a monolithically integrated circuit; and
a printed circuit board having a first region and a second region and a top and a bottom;
at least two terminal contacts arranged on the printed circuit board;
two conductive traces that are connected to the at least two terminal contacts, and
wherein the two terminal contacts are configured as contact holes passing through the printed circuit board and are arranged in the first region of the printed circuit board,
wherein the semiconductor body is a die that is arranged in the second region on the top of the printed circuit board,
wherein the semiconductor body is completely covered with a potting compound on the top of the printed circuit board,
wherein the printed circuit board is covered with the potting compound in the second region,
wherein the bottom of the printed circuit board forms a part of the IC package,
wherein the contact holes have a uniform inside diameter with metal inside walls, and are formed to accommodate electrically conductive press-fit pins to create a press-fit connection and thus an electrical connection to at least one additional electrical component,
wherein the first region and the second region are designed to be contiguous in each case,
wherein the printed circuit board has no potting compound in the first region,
wherein the press-fit pins are a part of a stamped lead frame and are joined to the stamped lead frame as a single piece,
wherein the printed circuit board forms a frictional connection solely via the press-fit pins and forms an electrically conductive connection to the stamped lead frame solely by the press-fit pins, and
wherein the IC package terminates flush with the edge of the printed circuit board on three sides.

* * * * *